United States Patent [19]

Osada et al.

[11] Patent Number: 5,563,101

[45] Date of Patent: *Oct. 8, 1996

[54] SUBSTRATE FOR SEMICONDUCTOR APPARATUS

[75] Inventors: Mituo Osada; Yoshinari Amano; Nobuo Ogasa; Akira Ohtsuka, all of Itami, Japan

[73] Assignee: Sumitomo Electric Industries, Ltd., Osaka, Japan

[ * ] Notice: The term of this patent shall not extend beyond the expiration date of Pat. No. 5,409,864.

[21] Appl. No.: 368,636

[22] Filed: Jan. 4, 1995

Related U.S. Application Data

[63] Continuation of Ser. No. 284,277, Aug. 2, 1994, Pat. No. 5,409,864, which is a continuation of Ser. No. 82,812, Jun. 28, 1993, abandoned, which is a continuation of Ser. No. 717,462, Jun. 17, 1991, abandoned, which is a division of Ser. No. 382,056, Jul. 13, 1989, Pat. No. 5,086,333, which is a continuation of Ser. No. 90,392, Aug. 27, 1987, abandoned, which is a continuation of Ser. No. 831,124, Feb. 21, 1986, abandoned, which is a continuation of Ser. No. 515,890, Jul. 21, 1983, abandoned.

[51] Int. Cl.$^6$ ............................................. H01L 21/60
[52] U.S. Cl. ........................ 437/209; 437/214; 437/217; 437/219
[58] Field of Search .................................. 437/209, 210, 437/211, 212, 213, 214, 215, 216, 217, 218, 219, 220, 221, 222, 223, 224; 257/684, 729, 705

[56] References Cited

U.S. PATENT DOCUMENTS

| | | | |
|---|---|---|---|
| 1,552,184 | 9/1925 | Adams . | |
| 1,848,437 | 3/1932 | Sieger et al. . | |
| 1,860,793 | 5/1932 | Weiger . | |
| 2,179,960 | 11/1939 | Schwarzkopf | 75/22 |
| 2,763,822 | 9/1956 | Frola et al. | 317/234 |
| 2,971,251 | 2/1961 | Willemse | 29/195 |
| 3,097,329 | 7/1963 | Siemens | 317/234 |
| 3,204,158 | 8/1965 | Schreiner et al. | 357/67 |
| 3,353,931 | 11/1967 | Zdanuk et al. | 29/182.1 |
| 3,423,203 | 1/1969 | Zdanuk et al. | 75/208 |
| 3,685,134 | 8/1972 | Blue | 29/420.5 |
| 3,969,754 | 7/1976 | Kuniya et al. | 357/65 |
| 4,158,719 | 6/1979 | Frantz | 428/567 |
| 4,196,442 | 4/1980 | Kuniya et al. | 357/67 |
| 4,291,815 | 9/1981 | Gordon et al. | 437/215 |
| 4,427,993 | 1/1984 | Fichot et al. | 357/81 |
| 4,451,540 | 5/1984 | Baird et al. | 428/615 |
| 4,517,504 | 5/1985 | Matsushita et al. | 257/705 |
| 4,680,618 | 7/1987 | Kuroda et al. | 357/74 |
| 5,086,333 | 2/1992 | Osada et al. | 357/67 |
| 5,099,310 | 3/1992 | Osada et al. | 357/81 |
| 5,409,864 | 4/1995 | Osada et al. | 437/209 |

FOREIGN PATENT DOCUMENTS

| | | |
|---|---|---|
| 1143588 | 2/1963 | Germany . |
| 2853951 | 7/1980 | Germany . |
| 50-62776 | 5/1975 | Japan . |
| 56-030092 | 3/1981 | Japan . |
| 57-152438 | 9/1982 | Japan . |
| 58-067049 | 4/1983 | Japan . |
| 857569 | 12/1960 | United Kingdom . |
| 931820 | 7/1963 | United Kingdom . |

OTHER PUBLICATIONS

Benesovsky, *Powder Metallurgy and Sintered Materials*, Metallwerk Plansee AG & Co. KG, Germany, 1973, pp. 146–156.
*ELMET Contact Materials*, Metallwerk Plansee AG & Co., Germany, 1977.
Benesovsky, *Powder Metallurgy and Sintered Materials*, Metallwerk Plansee AG & Co., Germany, 1973, pp. 10–11.
*Elkonite Data Book*, P. R. Mallory & Co., Indianapolis, Ind., 1941, pp. 1–30.
*Resistance Welding Data Book*, P. R. Mallory & Co., Indianapolis, Ind., 1951, pp. 308–309.
*Mallory Catalog*, P. R. Mallory & Co., Indianapolis, Ind., 1950, pp. 30–33.
*Mallory Product Guide*, P. R. Mallory & Co., Indianapolis, Ind., 1962, p. 22.
*Elkonite Refractory Metal Composites Catalog*, P. R. Mallory & Co., Indianapolis, Ind., 1962.
*Elkonite Refractory Metal Composites Catalog*, P. R. Mallory & Co., Indianapolis, Ind., 1968.
*Elkonite Catalog*, Contact Metals Welding Inc., Indianapolis, Ind. 1981, pp. 308–309.
*Thermkon Catalog*, Contact Metals Welding Inc., Indianapolis, Inc., 1982 (Copyright Registration Sep. 27, 1982).
Thermkon Trademark Registration No. 1,354,948, Aug. 20, 1985.
*Thermkon Catalog*, Contact Metals Welding Inc., Indianapolis, Ind., 1987.
German, *Liquid Phase Sintering*, NY and London, 1985, pp. 160–163.
Jones, *Fundamental Principles of Powder Metallurgy*, London, 1960, pp. 504–509, 770–773.
Sands et al., *Powder Metallurgy Practice and Applications*, London, 1966, pp. 94–95.
Kosco, "New Low Expansion Alloys for Semiconductor Applications", *Solid State Technology*, Jan. 1969, pp. 47–49.
Hirschhorn, *Introduction to Powder Metallurgy*, NY, 1969, pp. 244–245.
Meyer, "How to Select Electrical Contacts", *Metal Progress*, US, vol. 88, Jun. 1965–Dec. 1965, pp. 92–95.

(List continued on next page.)

*Primary Examiner*—Kevin M. Picardat
*Attorney, Agent, or Firm*—Foley & Lardner

[57] ABSTRACT

This invention relates to a substrate for semiconductor apparatus loading a semiconductor chip in an integrated circuit apparatus and is characterized in that a sintered compact containing copper of 2 to 30 wt. % in tungsten and/or molybdenum is used as the substrate having the heat radiation capable of efficiently radiating heat developed from the loaded semiconductor chip and thermal expansion coefficient similar to those of semiconductor chip and other enclosure material except for the substrate.

50 Claims, No Drawings

OTHER PUBLICATIONS

Yih and Wang, *Tungsten, Sources, Metallurgy, Properties and Applications*, New York and London, 1979, pp. 362–363.

Shinbun, *Powder Metallurgy and Sintered Materials*, Japan, 1964, pp. 264–267.

Sebastian et al., "Liquid Phase Sintering," *Powder Metallurgy International*, vol. 11, No. 2, pp. 62–64, (1979).

Naidich et al., "Densification in Liquid Phase Sintering Under Pressure in The System Tungsten–Copper," translated from *Porosbkovaya Metallurgiya*, No. 1 (133) pp. 34–39, Jan. 1974.

Sebastian et al., "Densification in W–Cu Sintered Alloys Produced from Coreduced Powders," *Planseeberichte für Pulvermetallurgie*, Bd. 25, No. 2, pp. 84–100, Jun. 1977.

SUBSTRATE FOR SEMICONDUCTOR APPARATUS

This application is a continuation of application Ser. No. 08/284,277, filed Aug. 2, 1994, now U.S. Pat. No. 5,409,864 which is a continuation of application Ser. No. 08/082,812, filed Jun. 28, 1993, now abandoned, which is a continuation of application Ser. No. 07/717,462, filed Jun. 17, 1991, now abandoned, which is a divisional of application Ser. No. 07/382,056, filed Jul. 13, 1989, now U.S. Pat. No. 5,086,333, which is a continuation of application Ser. No. 07/090,392, filed Aug. 27, 1987, now abandoned, which is a continuation of application Ser. No. 06/831,124, filed Feb. 21, 1986, now abandoned, which is a continuation of application Ser. No. 06/515,890, filed Jul. 21, 1983, now abandoned.

This invention relates to a substrate for mounting a semiconductor chip used in an integrated circuit or the like. An object of the invention is to provide a superior substrate for mounting the semiconductor chip, which is capable of efficiently radiating heat developed from the mounted semiconductor chip and the substrate having a thermal expansion coefficient similar to those of semiconductor chip and material of other materials surrounding the same.

Substrates for mounting semiconductor chips have conventionally been made of a Ni alloy consisting of Kovar (29% Ni—17% Co—Fe), 42 alloy; etc, or ceramics, such as alumina, forsterite, etc. The conventional substrates have coefficients thermal expansion similar to that of the semiconductor chip, and when high heat radiation is also required, various Cu alloys have been used.

However, recent remarkable progress in the semiconductor industry has promoted greater size of semiconductor chips or increased amounts of heat generation and the demand for a substrate material to meet both the characteristics of thermal expansion coefficient and heat radiation has been on the increase.

Under such conditions, tungsten, molybdenum, beryllia, etc., have been proposed as materials to meet both of the above characteristics.

Beryllia, however, in fact is not usable from the standpoint of environmental pollution. Although the thermal expansion coefficient of tungsten or beryllia corresponds well to that of the semiconductor chip, it has a large difference from that of alumina often used as the enclosure material and also from that of GaAs which has been used in increasing amounts for semiconductor chips. Furthermore tungsten and molybdenum are inferior to beryllia in heat radiation so as to be largely restricted in the packaging design.

The inventors, after conducting research of elimination on the above defects in materials for conventional substrates for mounting semiconductor chips to thereby control a thermal expansion coefficient and obtain a substrate material of good heat conductivity, have arrived at the present invention.

In other words, the semiconductor chip bearing substrate has a thermal expansion coefficient similar to those of semiconductor chips and enclosure materials, and is superior in heat conductivity. It comprises a sintered compact containing copper at 2 to 30% and tungsten and/or molybdenum.

When electrical insulation is required, the substrate is given a thin-layer coating of ceramic or organic insulator, instead of conventional ceramic.

In this invention, there is employed in the amount Cu of 2 to 30 wt. % and W and/or Mo to obtain a thermal expansion coefficient of the substrate as similar as possible to those of Si and GaAs or sintered alumina or other enclosure materials, thereby reducing, to the extent possible, the influence of stress caused by the mismatch between the thermal expansion coefficients of the substrate and semiconductor chip and enclosure material. Hence, a proper amount of Cu need only be selected in the above range corresponding to the formation and size of the package.

This inventive substrate containing Cu and W and/or Mo is produced by powder metallurgy, because the manufacture of the same by the melting method is difficult due to the melting point and specific gravity difference between Cu, W and Mo. Among the powder metallurgy methods, sintering and infiltration are preferable.

Also, it is possible to make the W and/or Mo skeleton by adding thereto an iron group element at 20 wt. % or less.

A preferable amount of iron group element to be added is below 5 wt. %, but even above that, up to 20 wt. %, will form the skeleton.

The addition of an amount over 20 wt. %, however, is not preferred because the sintered compact produced is defective in the thermal characteristics and thus will not to attain the objects of the invention.

The amount of iron group element, even when added to both W and Mo, can be added to W or Mo independently.

As seen from the above, the substrate of the invention can meet the increasing demand for large and high density semiconductor chip and be applicable as a substrate for the GaAs chip which is being put into practical use together with an Si chip.

Next, embodiments of the invention will be detailed as follows.

EXAMPLE 1

Tungsten and a powder mixture of the same and an iron group element were compacted in the size of 100×100×5 mm respectively, and sintered under an $H_2$ gas atmosphere at a temperature of 1000° to 1400° C., thereby obtaining an intermediate sintered compact with porosity of 1 to 50%. Cu was infiltrated into the sintered compact under the $H_2$ gas atmosphere at a temperature of 1200° C. to produce Cu-W alloy of Cu content of 1 to 40 wt. %. The Cu-W alloy thus produced was measured for thermal expansion coefficient and thermal conductivity to obtain the results in Table 1.

In addition, the thermal expansion coefficients of $Al_2O_3$, Si, and GaAs were entered therein. The marks * in Table 1 represent comparison examples outside the scope of the invention.

TABLE 1

| No. | Alloy Composition | Thermal Expansion Coefficient ($\times 10^{-6}$/°C.) | Thermal Conductivity (cal/cm.sec.°C.) |
| --- | --- | --- | --- |
| 1* | 1Cu-99W | 4.7 | 0.40 |
| 2 | 5Cu-95W | 5.2 | 0.45 |
| 3 | 10Cu-90W | 7.0 | 0.50 |
| 4 | 15Cu-85W | 7.9 | 0.54 |
| 5 | 20Cu-80W | 8.3 | 0.58 |
| 6 | 25Cu-75W | 9.0 | 0.62 |
| 7 | 30Cu-70W | 9.7 | 0.65 |
| 8* | 35Cu-65W | 11.0 | 0.69 |
| 9* | 40Cu-60W | 11.8 | 0.73 |
| 10 | 10Cu-89W-1Ni | 7.0 | 0.48 |
| 11 | 20Cu-79.5W-0.5Ni | 8.2 | 0.57 |
| 12 | 5Cu-80W-15Fe | 7.9 | 0.42 |

TABLE 1-continued

| Alloy No. | Composition | Thermal Expansion Coefficient ($\times 10^{-6}/°C$) | Thermal Conductivity (cal/cm.sec.°C) |
|---|---|---|---|
| 13 | 10Cu-79W-11Co | 8.1 | 0.46 |
| 14* | $Al_2O_3$ | 7.2 | |
| 15* | Si | 4.0 | |
| 16* | GaAs | 6.7 | |

In the above table, IC package using Cu-W alloy sintered compact (No. 3) of Cu content of 10 wt. % as the substrate material for mounting an Si chip produced no heat distortion due to a small difference between the thermal expansion coefficients of Si chip and other enclosure base materials of $Al_2O_3$ during the mounting process and an extremely good heat radiation and the device could produce an IC longer in life span and of high reliability.

EXAMPLE 2

Molybdenum and a powder mixture of the same and iron group element were compacted in the size of 100×100×5 mm respectively, and then were sintered under an $H_2$ gas atmosphere at a temperature of 1000° to 1400° C., thereby obtaining an intermediate sintered compact with a porosity of 1 to 50%.

Copper was infiltrated into the intermediate sintered compact under an $H_2$ gas atmosphere at a temperature of 1200° C., thereby producing a Cu-Mo alloy of copper content of 1 to 50 wt. %.

The Cu-Mo alloy thus produced was measured for the thermal expansion coefficient and heat conductivity, thereby having obtained the results in Table 2.

In addition, the marks * show comparison examples outside the scope of the invention.

TABLE 2

| Alloy No. | Composition | Thermal Expansion Coefficient ($\times 10^{-6}/°C$) | Thermal Conductivity (cal/cm.sec.°C) |
|---|---|---|---|
| 1* | 1Cu-99Mo | 5.3 | 0.35 |
| 2 | 5Cu-95Mo | 5.9 | 0.38 |
| 3 | 15Cu-90Mo | 6.5 | 0.41 |
| 4 | 15Cu-85Mo | 7.1 | 0.44 |
| 5 | 20Cu-80Mo | 7.9 | 0.48 |
| 6 | 25Cu-75Mo | 8.4 | 0.50 |
| 7 | 30Cu-70Mo | 9.1 | 0.54 |
| 8* | 35Cu-65Mo | 9.7 | 0.57 |
| 9* | 40Cu-60Mo | 10.3 | 0.60 |
| 10* | 50Cu-50Mo | 11.5 | 0.66 |
| 11 | 10Cu-89.5Mo-0.5Ni | 6.5 | 0.39 |
| 12 | 15Cu-82.0Mo-3.0Ni | 7.2 | 0.41 |
| 13 | 5Cu-78Mo-17Fe | 8.2 | 0.36 |
| 14 | 10Cu-82Mo-8Co | 7.8 | 0.40 |

In the above table 2, an IC package using a Cu-Mo alloy sintered compact (No. 4) as the substrate base material for mounting an Si chip produced no heat distortion at all due to a small difference between the thermal expansion coefficients of the Si chip and other enclosure base materials of $Al_2O_3$ during the mounting process and an extremely good heat radiation and the device could obtain an IC longer in life span and of high reliability.

EXAMPLE 3

Tungsten, molybdenum powder or tungsten-molybdenum alloy powder and the required amounts of copper powder and iron group powder were mixed as shown in Table 3, and the powder was mixed by an attrition mixer uniformly for three hours, compacted to the size of 30×30×5 mm under pressure of 1 t/cm², and then sintered under the $H_2$ gas atmosphere at a temperature of 1450° C. for one hour.

The alloy thus produced was measured for thermal expansion coefficient and heat conductivity, with the results set forth in Table 3. In addition, in Table 3, the marks * represent comparative examples outside the scope of the invention.

TABLE 3

| Alloy No. | Composition | Thermal Expansion Coefficient ($\times 10^{-6}/°C$) | Thermal Conductivity (cal/cm.sec.°C) |
|---|---|---|---|
| 1 | 15Cu-85W | 8.2 | 0.50 |
| 2 | 20Cu-79W-1Ni | 8.5 | 0.48 |
| 3 | 20Cu-75W-5Co | 8.7 | 0.47 |
| 4 | 30Cu-68W-2Fe | 9.9 | 0.50 |
| 5 | 20Cu-70W-10Mo | 8.5 | 0.54 |
| 6* | 35Cu-65W | 11.5 | 0.61 |

What is claimed is:

1. A method of packaging a semiconductor chip which comprises the steps of:

(a) providing a first member comprising alumina, said first member forming at least part of an enclosure for said semiconductor chip;

(b) producing a second member by a powder metallurgical method, wherein the powder metallurgical method comprises one of the steps of:

(1) mixing tungsten, molybdenum, or tungsten and molybdenum, and copper powders, forming a mixed powder compact and sintering said mixed powder compact at a temperature higher than the melting point of copper, and (2) forming tungsten powder, molybdenum powder, or a mixture thereof into a powder compact, sintering said powder compact to form a sintered compact, and infiltrating said sintered compact with molten copper;

(c) selecting a copper content within the range of 5–30 percent by weight such that said second member has a thermal conductivity of at least 0.35 cal/cm. sec. °C. and a thermal expansion coefficient which is similar to that of the first member; and (d) housing said semiconductor chip with said first and second members.

2. The method of packaging a semiconductor chip as recited in claim 1 where the step of producing the second member includes forming said second member as a substrate for said semiconductor chip.

3. The method of packaging a semiconductor chip as recited in claim 1 or 2, wherein said powder metallurgical method is defined by step (b)(2).

4. The method of packaging a semiconductor chip as recited in claim 3, wherein said infiltrating of step (b)(2) is conducted in a hydrogen atmosphere.

5. The method of packaging a semiconductor chip as recited in claim 3, wherein said sintering of step (b)(2) is conducted at a temperature of 1000°–1400° C.

6. The method of packaging a semiconductor chip as recited in claim 1 or 2, wherein said copper content is 10–20 percent by weight.

7. The method of packaging a semiconductor chip as recited in claim 6, wherein the thermal expansion coefficient of the second member is in the range of 6.5 to $8.3 \times 10^{-6}$° C.

8. The method of packaging a semiconductor chip as recited in claim 1 or 2, wherein the thermal expansion coefficient of the second member is in the range of 5.2 to $9.7\times10^{-6}$°C.

9. A method of housing a semiconductor chip to form an integrated circuit package having a first member made from alumina and a second member, comprising the steps of:

(a) mixing, pressing and sintering one of tungsten and molybdenum powders to form a sintered compact;

(b) infiltrating said sintered compact with molten copper to form said second member; and (c) housing said semiconductor chip with said first and second members to form said integrated circuit package;

wherein said molten copper comprises 5–30 percent wt of said second member and said second member has a thermal conductivity of at least 0.35 cal/cm. sec.°C. and a thermal expansion coefficient which is similar to that of the first member, said first member forming at least part of an enclosure material of said package.

10. A method of housing a semiconductor chip to form an integrated circuit package having a first member made from alumina and a second member, comprising the steps of:

(a) mixing and pressing (i) at least one of tungsten and molybdenum powders and (ii) copper powders to form a pressed mixture;

(b) sintering said pressed mixture to form said second member, wherein said sintering takes place at temperatures sufficient to produce molten copper within said pressed mixture; and (c) housing said semiconductor device with said first and second members to form said integrated circuit package, wherein said molten copper comprises 5–30 percent wt of said second member and said second member has a thermal conductivity of at least 0.35 cal/cm. sec. °C. and a thermal expansion coefficient which is similar to that of the first member, said first member forming at least part of an enclosure material for said package.

11. A method of housing a semiconductor chip to form an integrated circuit package as recited in claim 9 or 10 where the step of producing the second member includes forming said second member as a substrate for said semiconductor chip.

12. A method of packaging a semiconductor chip which comprises the steps of:

(a) providing a first member comprising alumina, said first member forming at least part of an enclosure for said semiconductor chip;

(b) producing a second member by a powder metallurgical method, wherein the powder metallurgical method comprises one of the steps of:

(1) mixing tungsten, molybdenum, or tungsten and molybdenum, and copper powders, forming a mixed powder compact and sintering said mixed powder compact at a temperature higher than the melting point of copper, and (2) forming tungsten powder, molybdenum powder, or a mixture thereof into a powder compact, sintering said powder compact to form a sintered compact, and infiltrating said sintered compact with molten copper;

(c) selecting a copper content within the range of 5–30 percent by weight such that said second member has a thermal expansion coefficient between 5.2 and $9.7\times10^{-6}$/°C.; and (d) housing said integrated circuit with said first and second members.

13. A method of packaging a semiconductor chip as recited in claim 12 where the step of producing the second member includes forming said second member as a substrate for said semiconductor chip.

14. A method of packaging a semiconductor chip as recited in claim 12 or 13, wherein said powder metallurgical method is defined by step (b)(2).

15. A method of packaging a semiconductor chip as recited in claim 14, wherein said infiltrating of step (b)(2) is conducted in a hydrogen atmosphere.

16. A method of making an integrated circuit package as recited in claim 14, wherein said sintering of step (b) (2) is conducted at a temperature of 1000°–1400° C.

17. A method of making an integrated circuit package as recited in claim 12 or 13, wherein said copper content is 10–20 percent by weight and said thermal expansion coefficient is between 6.5 and $8.3\times10^{-6}$°C.

18. A method of housing a semiconductor chip to form an integrated circuit package having a first member made from alumina and a second member, comprising the steps of:

(a) mixing, pressing and sintering one of tungsten and molybdenum powders to form a sintered compact;

(b) infiltrating said sintered compact with molten copper to form said second member; and (c) housing said semiconductor chip with said first and second members to form said integrated circuit package;

wherein said molten copper comprises 5–20 percent wt of said second member and said second member has a thermal conductivity of at least 0.35 cal/cm. sec. °C. and a thermal expansion coefficient between 5.2 and $8.3\times10^{-6}$/°C., said first member forming at least part of an enclosure material of said package.

19. A method for housing a semiconductor device to form an integrated circuit package having a first member made from alumina and a second member, comprising the steps of:

(a) mixing and pressing (i) at least one of tungsten and molybdenum powders and (ii) copper powders to form a pressed mixture;

(b) sintering said pressed mixture to form said second member, wherein said sintering takes place at temperatures sufficient to produce molten copper within said pressed mixture; and (c) housing said semiconductor device with said first and second members to form said integrated circuit package, said first member forming at least part of an enclosure material for said package;

wherein said molten copper comprises 5–20 percent wt of said second member and said second member has a thermal conductivity of at least 0.35 cal/cm. sec. °C. and a thermal expansion coefficient between 5.2 and $8.3\times10^{-6}$/°C.

20. A method comprising the steps of:

I. making an integrated circuit package for housing a semiconductor chip which comprises:

(a) providing a first member comprising alumina, said first member forming at least part of an enclosure for said semiconductor chip;

(b) producing a second member by one of the steps of:

(1) mixing tungsten, molybdenum, or tungsten and molybdenum, and copper powders, forming a mixed powder compact and sintering said mixed powder compact at a temperature higher than the melting point of copper, and (2) forming tungsten powder, molybdenum powder, or a mixture thereof into a powder compact, sintering said powder compact to form a sintered compact, and infiltrating said sintered compact with molten copper;

(c) selecting a copper content within the range of 5–30 percent by weight such that said second member has a thermal conductivity of at least 0.35 cal/cm. sec. °C. and a thermal expansion coefficient which is similar to that of the first member; and II. housing said semiconductor chip with said first and second members.

21. The method of packaging a semiconductor chip as recited in claim 20, where the step of producing the second member includes forming said second member as a substrate for said semiconductor chip.

22. The method of packaging a semiconductor chip as recited in claim 20 or 21, wherein said second member is produced by step (b) (2).

23. The method of packaging a semiconductor chip as recited in claim 22, wherein said infiltrating of step I. (b)(2) is conducted in a hydrogen atmosphere.

24. The method of packaging a semiconductor chip as recited in claim 22, wherein said sintering of step I. (b)(2) is conducted at a temperature of 1000°–1400° C.

25. The method of packaging a semiconductor chip as recited in claim 20 or 21, wherein said copper content is 10–20 percent by weight.

26. The method of packaging a semiconductor chip as recited in claim 25, wherein the thermal expansion coefficient of the second member is in the range of 6.5 to $8.3 \times 10^{-6}$° C.

27. The method of packaging a semiconductor chip as recited in claim 20 or 21, wherein the thermal expansion coefficient of the second member is in the range of 5.2 to $9.7 \times 10^{-6}$° C.

28. A method comprising the steps of:

I. forming an integrated circuit package for a semiconductor chip, said package having a first member made from alumina and a second member made by the steps of:

(a) mixing, pressing and sintering one of tungsten and molybdenum or a mixture of tungsten and molybdenum to form a sintered compact;

(b) infiltrating said sintered compact with molten copper to form said second member;

wherein said molten copper comprises 5–30 percent wt of said second member and said second member has a thermal conductivity of at least 0.35 cal/cm. sec.°C. and a thermal expansion coefficient which is similar to that of the first member, and II. housing said semiconductor chip with said first and second members to form said integrated circuit package, said first member forming at least part of an enclosure material of said package.

29. A method comprising the steps of:

I. forming an integrated circuit package for a semiconductor chip, said package having a first member made from alumina and a second member made by the steps of:

(a) mixing and pressing (i) at least one of tungsten and molybdenum powders and (ii) copper powders to form a pressed mixture;

(b) sintering said pressed mixture to form said second member, wherein said sintering takes place at temperatures sufficient to produce molten copper within said pressed mixture;

wherein said molten copper comprises 5–30 percent wt of said second member and said second member has a thermal conductivity of at least 0.35 cal/cm. sec. °C. and a thermal expansion coefficient which is similar to that of the first member, and II. housing said semiconductor device with said first and second members to form said integrated circuit package, said first member forming at least part of an enclosure material for said package.

30. A method as recited in claim 28 or 29 where the step of producing the second member includes forming said second member as a substrate for said semiconductor chip.

31. A method comprising the steps of:

(a) providing a first member comprising, said first member forming at least part of an enclosure for a semiconductor chip;

(b) producing a second member by a powder metallurgical method, wherein the powder metallurgical method comprises one of the steps of:

(1) mixing tungsten, molybdenum, or tungsten and molybdenum, and copper powders, forming a mixed powder compact and sintering said mixed powder compact at a temperature higher than the melting point of copper, and (2) forming tungsten powder, molybdenum powder, or a mixture thereof into a powder compact, sintering said powder compact to form a sintered compact, and infiltrating said sintered compact with molten copper;

(c) selecting a copper content within the range of 5–30 percent by weight such that said second member has a thermal expansion coefficient between 5.2 and $9.7 \times 10^{-6}$/° C., and a thermal conductivity of at least 0.35 cal/cm. sec. °C.; and (d) housing said semiconductor chip with said first and second members.

32. A method of packaging a semiconductor chip as recited in claim 31, where the step of producing the second member includes forming said second member as a substrate for said semiconductor chip.

33. A method of packaging a semiconductor chip as recited in claim 31 or 32, wherein said powder metallurgical method is defined by step (b)(2).

34. A method of packaging a semiconductor chip as recited in claim 33, wherein said infiltrating is conducted in a hydrogen atmosphere.

35. A method of making an integrated circuit package as recited in claim 34, wherein said sintering is conducted at a temperature of 1000°–1400° C.

36. A method of making an integrated circuit package as recited in claim 31 or 32, wherein said copper content is 10–20 percent by weight and said thermal expansion coefficient is between 6.5 and $8.3 \times 10^{-6}$/°C.

37. A method of making a package for housing an integrated circuit which comprises the steps of:

(a) providing a first member comprising alumina, said first member forming at least part of an enclosure for said package;

(b) producing a second member by a powder metallurgical method, wherein the powder metallurgical method comprises one of the steps of:

(1) mixing tungsten, molybdenum, or tungsten and molybdenum, and copper powders, forming a mixed powder compact and sintering said mixed powder compact at a temperature higher than the melting point of copper, and (2) forming tungsten powder, molybdenum powder, or a mixture thereof into a powder compact, sintering said powder compact to form a sintered compact, and infiltrating said sintered compact with molten copper;

(c) selecting a copper content within the range of 5–30 percent by weight such that said second member has a thermal conductivity of at least 0.35 cal/cm. sec. °C. and a thermal expansion coefficient which is similar to that of the first member; and (d) making said package using said first and second members.

38. The method of packaging a semiconductor chip as recited in claim 37 where the step of producing the second member includes forming said second member as a substrate for said integrated circuit.

39. The method of packaging a semiconductor chip as recited in claim 37 or 38 wherein said powder metallurgical method is defined by step (b)(2).

40. The method of packaging a semiconductor chip as recited in claim 39, wherein said infiltrating of step (b)(2) is conducted in a hydrogen atmosphere.

41. The method of packaging a semiconductor chip as recited in claim 39, wherein said sintering of step (b)(2) is conducted at a temperature of 1000°–1400° C.

42. The method of packaging a semiconductor chip as recited in claim 37 or 38, wherein said copper content is 10–20 percent by weight.

43. The method of packaging a semiconductor chip as recited in claim 42, wherein the thermal expansion coefficient of the second member is in the range of 6.5 to $8.3 \times 10^{-6}$° C.

44. The method of packaging a semiconductor chip as recited in claim 37 or 38, wherein the thermal expansion coefficient of the second member is in the range of 5.2 to $9.7 \times 10^{-6}$° C.

45. A method of making a package for housing an integrated circuit which comprises the steps of:

(a) providing a first member comprising alumina, said first member forming at least part of an enclosure for said integrated circuit;

(b) producing a second member by a powder metallurgical method, wherein the powder metallurgical method comprises one of the steps of:

(1) mixing tungsten, molybdenum, or tungsten and molybdenum, and copper powders, forming a mixed powder compact and sintering said mixed powder compact at a temperature higher than the melting point of copper, and (2) forming tungsten powder, molybdenum powder, or a mixture thereof into a powder compact, sintering said powder compact to form a sintered compact, and infiltrating said sintered compact with molten copper;

(c) selecting a copper content within the range of 5–30 percent by weight such that said second member has a thermal expansion coefficient between 5.2 and $9.7 \times 10^{-6}$/°C.; and (d) making said package using said first and second members.

46. A method of packaging a semiconductor chip as recited in claim 45 where the step of producing the second member includes forming said second member as a substrate for said semiconductor chip.

47. A method of packaging a semiconductor chip as recited in claim 45 or 46, wherein said powder metallurgical method is defined by step (b)(2).

48. A method of packaging a semiconductor chip as recited in claim 47, wherein said infiltrating of step (b) (2) is conducted in a hydrogen atmosphere.

49. A method of making an integrated circuit package as recited in claim 47, wherein said sintering of step (b)(2) is conducted at a temperature of 1000°–1400° C.

50. A method of making an integrated circuit package as recited in claim 45 or 46, wherein said copper content is 10–20 percent by weight and said thermal expansion coefficient is between 6.5 and $8.3 \times 10^{-6}$° C.

* * * * *